(12) United States Patent
Yokokawa et al.

(10) Patent No.: US 10,204,824 B2
(45) Date of Patent: Feb. 12, 2019

(54) METHOD FOR PRODUCING SOI WAFER

(71) Applicant: SHIN-ETSU HANDOTAI CO., LTD., Tokyo (JP)

(72) Inventors: Isao Yokokawa, Takasaki (JP); Hiroji Aga, Takasaki (JP); Norihiro Kobayashi, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/574,326

(22) PCT Filed: Mar. 8, 2016

(86) PCT No.: PCT/JP2016/001235
§ 371 (c)(1),
(2) Date: Nov. 15, 2017

(87) PCT Pub. No.: WO2016/203677
PCT Pub. Date: Dec. 22, 2016

(65) Prior Publication Data
US 2018/0144975 A1    May 24, 2018

(30) Foreign Application Priority Data
Jun. 15, 2015   (JP) .................................. 2015-120424

(51) Int. Cl.
*H01L 21/00*         (2006.01)
*H01L 21/762*        (2006.01)
(Continued)

(52) U.S. Cl.
CPC ........ *H01L 21/76254* (2013.01); *H01L 21/02* (2013.01); *H01L 21/2007* (2013.01); *H01L 27/12* (2013.01); *H01L 27/1203* (2013.01)

(58) Field of Classification Search
CPC ............... H01L 21/76254; H01L 21/02; H01L 21/2007; H01L 27/12; H01L 27/1203
See application file for complete search history.

(56) References Cited

U.S. PATENT DOCUMENTS 6,362,076 B1    3/2002  Inazuki et al.
6,372,609 B1 *  4/2002  Aga .................. H01L 21/76254
                                              438/459
(Continued)

FOREIGN PATENT DOCUMENTS

JP      H05-211128 A      8/1993
JP      H11-307472 A     11/1999
(Continued)

OTHER PUBLICATIONS

Dec. 12, 2017 Notification of Reasons for Refusal issued in Japanese Patent Application No. 2015-120424.
(Continued)

*Primary Examiner* — Richard A Booth
(74) *Attorney, Agent, or Firm* — Oliff PLC

(57) ABSTRACT

A method for producing a SOI wafer that includes implanting at least one type of gas ion selected from a hydrogen ion and a rare gas ion from a surface of a bond wafer formed of a silicon single crystal to form an ion implanted layer, bonding the ion-implanted surface of the bond wafer to a surface of a base wafer formed of a silicon single crystal through a silicon oxide film formed on the base wafer surface, delaminating the bond wafer at the ion implanted layer by performing delamination heat treatment to fabricate a SOI wafer having a buried oxide film layer and a SOI layer on the base wafer, and performing flattening heat treatment on the SOI wafer in an atmosphere containing argon gas.

3 Claims, 3 Drawing Sheets

(51) Int. Cl.
*H01L 21/02* (2006.01)
*H01L 27/12* (2006.01)
*H01L 21/20* (2006.01)

(56) References Cited

U.S. PATENT DOCUMENTS

| | | | |
|---|---|---|---|
| 8,361,888 B2* | 1/2013 | Yokokawa | H01L 21/02532 |
| | | | 257/627 |
| 2008/0020514 A1 | 1/2008 | Okuda et al. | |
| 2010/0129993 A1 | 5/2010 | Yokokawa et al. | |

FOREIGN PATENT DOCUMENTS

| | | |
|---|---|---|
| JP | 2000-124092 A | 4/2000 |
| JP | 2004-071836 A | 3/2004 |
| JP | 2006-156858 A | 6/2006 |
| JP | 2008-028070 A | 2/2008 |
| JP | 2009-027124 A | 2/2009 |
| JP | 2013-084663 A | 5/2013 |

OTHER PUBLICATIONS

Dec. 19, 2017 International Preliminary Report on Patentability issued in International Patent Application No. PCT/JP2016/001235.
Jun. 14, 2016 International Search Report issued in International Patent Application No. PCT/JP2016/001235.
Apr. 3, 2018 Notification of Reasons for Refusal issued in Japanese Patent Application No. 2015-120424.

* cited by examiner (a) AFTER DELAMINATION  (b) SC-1 CLEANING OR THE LIKE  (c) Ar ANNEALING (a) JUST AFTER DELAMINATION  (b) REMOVAL OF Si THIN PIECES REDUCTION OF THICKNESS OF TERRACE OXIDE FILM  (c) FLATTENING HEAT TREATMENT (d) REMOVAL OF Si THIN PIECES COMPLETE REMOVAL OF TERRACE OXIDE FILM  (e) FLATTENING HEAT TREATMENT

METHOD FOR PRODUCING SOI WAFER

TECHNICAL FIELD

The present invention relates to a method for producing a SOI wafer and, in particular, to a method for producing a SOI wafer by using an ion implantation delamination method.

BACKGROUND ART

As a method for producing a SOI (Silicon on Insulator) wafer, in particular, a method for producing a thin-film SOI wafer that can enhance the performance of a leading-edge integrated circuit, attention is given to a method of producing a SOI wafer by delaminating an ion-implanted wafer after bonding (an ion implantation delamination method: a technology which is also called SmartCut®).

The ion implantation delamination method is a technology of producing a SOI wafer by: forming an oxide film on at least one of two silicon wafers and implanting gas ions such as hydrogen ions or rare gas ions into one (a bond wafer) of the silicon wafers from the upper surface thereof to form an ion implanted layer (also referred to as a microbubble layer or an encapsulated layer) in this wafer; bringing the ion-implanted surface into close contact with the other silicon wafer (a base wafer) with the oxide film sandwiched therebetween and then performing heat treatment (delamination heat treatment) to delaminate the one wafer (the bond wafer) in the form of a thin film by using the microbubble layer as a cleavage plane; and further performing heat treatment, (bonding heat treatment) to achieve firm bonding (refer to Patent Document 1). In this stage, the cleavage plane (the delaminating plane) is the surface of a SOI layer, and a SOI wafer whose SOI film thickness is small and highly uniform is obtained relatively easily.

However, a damaged layer caused by ion implantation is present on the SOI wafer surface subjected to delamination and the degree of surface roughness is higher than that of a mirror surface of a normal silicon wafer. Thus, in the ion implantation delamination method, it is necessary to remove such a damaged layer and surface roughness.

In the past, in order to remove the damaged layer or the like, mirror polishing (stock removal: about 100 nm) with an extremely small polishing stock removal, which is called touch polish, has been performed in the final process after the bonding heat treatment. However, if polishing including a mechanical processing element is performed on the SOI layer, a nonuniform stock removal of polishing undesirably decreases the film thickness uniformity of the SOI layer achieved by implantation of hydrogen ions or the like and delamination.

As a method for solving such a problem, flattening processing that improves surface roughness by performing high-temperature heat treatment in place of the touch polish have been performed. For instance, in Patent Document 2, performing heat treatment (rapid heating/rapid cooling heat treatment (RTA)) in a reducing atmosphere containing hydrogen without polishing the surface of a SOI layer after delamination heat treatment (or bonding heat treatment) is proposed.

Here, as described in (0065) paragraph of Patent Document 2, before performing heat treatment on the SOI layer surface (the delaminating plane) subjected to delamination, performing widely-known wet cleaning called so-called RCA cleaning is required to avoid contamination by particles, impurities, or the like.

Moreover, according to (0050) paragraph of Patent Document 3, when a SOI wafer with an oxide film in a terrace portion is fabricated by the ion implantation delamination method, silicon thin pieces adhere to the oxide film in the terrace portion at the time of delamination of a bond wafer, which becomes a cause of, for example, particle contamination by subsequent epitaxial growth. Patent Document 3 describes that, in order to avoid this problem, wet cleaning such as SC1 cleaning (cleaning by a mixed aqueous solution of $NH_4OH$ and $H_2O_2$) or HF cleaning is performed before epitaxial growth as a cleaning process that removes the silicon thin pieces present in the terrace portion.

Here, of SOI wafers with an oxide film in a terrace portion, in particular, when the BOX (buried oxide film) layer thickness of a SOI wafer is large and a few µm, in order to suppress the occurrence of warpage in the wafer, a backside oxide film having a similar thickness is formed. Such a SOI wafer having a large BOX layer thickness has been recently used for various purposes in Si photonics or RF devices (radio-frequency devices).

CITATION LIST

Patent Literature

Patent Document; 1: Japanese Unexamined Patent Application Publication No. H5-211128
Patent Document 2: Japanese Unexamined Patent Application Publication No. H11-307472
Patent Document 3: Japanese Unexamined Patent Application Publication No. 2009-27124

SUMMARY OF INVENTION

Technical Problem

As described in Patent Document 3, it is known that particles such as silicon thin pieces adhere to a terrace portion of a bonded wafer just after delamination.

As a result of the study conducted by the inventors of the present invention, it has been revealed that, if flattening heat treatment is performed in an atmosphere containing argon gas, with such silicon thin pieces being present on an oxide film in a terrace portion of a SOI wafer with a silicon oxide film in a terrace portion, the silicon thin pieces and the oxide film react and, based on a reaction formula: $Si+SiO_2 \rightarrow 2SiO$ (gas), the silicon oxide film in the terrace portion is greatly etched around the silicon thin pieces and depressions are formed. If a device production process is performed in a state in which such depressions are formed in the terrace portion, a photoresist tends to remain in the depressions, which becomes a generation source of contamination or particles.

The present invention has been made in view of the problems and an object thereof is to provide a method for producing a SOI wafer, the method that can flatten a delaminating plane without formation of unnecessary depressions in a terrace portion when flattening heat treatment is performed on a delaminating plane of a SOI wafer having a silicon oxide film in a terrace portion in an atmosphere containing argon gas, the SOI wafer fabricated by performing delamination heat treatment by an ion implantation delamination method.

Solution to Problem

To attain the object, the present invention provides a method for producing a SOI wafer, comprising: implanting at least one type of gas ion selected from a hydrogen ion and a rare gas ion from a surface of a bond wafer formed of a silicon single crystal to form an ion implanted layer, bonding the ion-implanted surface of the bond wafer to a surface of a base wafer formed of a silicon single crystal through a silicon oxide film formed on the base wafer surface, delaminating the bond wafer at the ion implanted layer by performing delamination heat treatment to fabricate a SOI wafer having a buried oxide film layer and a SOI layer on the base wafer, and performing flattening heat treatment on the SOI wafer in an atmosphere containing argon gas, wherein, after the delamination heat treatment, without inserting another heat treatment, processing to remove silicon thin pieces present on the silicon oxide film in a terrace portion of the SOI wafer is performed, and thereafter, the flattening heat treatment is performed in the atmosphere containing argon gas.

As described above, after the delamination heat treatment, without inserting another heat treatment, by performing the processing to remove the silicon thin pieces present on the oxide film in the terrace portion (hereinafter also referred to as the terrace oxide film) of the SOI wafer, and thereafter by performing the flattening heat treatment in the atmosphere containing argon gas, it is possible to flatten a delaminating plane without formation of unnecessary depressions in the terrace portion when performing the flattening heat treatment in the atmosphere containing argon gas.

At this time, the silicon thin pieces may be removed by performing, as the processing to remove the silicon thin pieces, etching to reduce the thickness of the silicon oxide film in the terrace portion by using an aqueous solution containing HF.

As described above, by reducing the thickness of the silicon oxide film in the terrace portion by using the aqueous solution containing HF (hydrogen fluoride), the silicon, oxide film between the silicon thin pieces and the terrace portion is removed, which makes it possible to perform lift-off of the silicon thin pieces.

Moreover, in the method for producing a SOI wafer of the present invention, as the processing to remove the silicon thin pieces, cleaning may also be performed by a physical action.

As described above, by performing cleaning by a physical action (for example, cleaning by which the wafer surface is rubbed), it is possible to remove the silicon thin pieces effectively.

Furthermore, in the method for producing a SOI wafer of the present invention, it is preferable that, after the processing to remove the silicon thin pieces is performed, and before the flattening heat treatment is performed in the atmosphere containing argon gas, sacrificial oxidation treatment is performed on the SOI layer of the SOI wafer.

As described above, by performing sacrificial oxidation treatment on the SOI layer of the SOI wafer, it is possible to remove the damage of the delaminating plane adequately and thereby obtain the SOI layer with good crystallinity.

Advantageous Effects of Invention

According to the present invention, since the silicon thin pieces on the terrace oxide film can be removed in a stage just after the delamination heat treatment in which adherence strength is low, it is possible to fabricate a bonded SOI wafer with no silicon thin piece on the terrace oxide film. By performing flattening of the SOI layer surface by high-temperature annealing in an atmosphere containing argon gas while maintaining this state, it is possible to prevent the appearance of bright spots (depressions) in the terrace portion.

DESCRIPTION OF EMBODIMENTS

Figure 2:
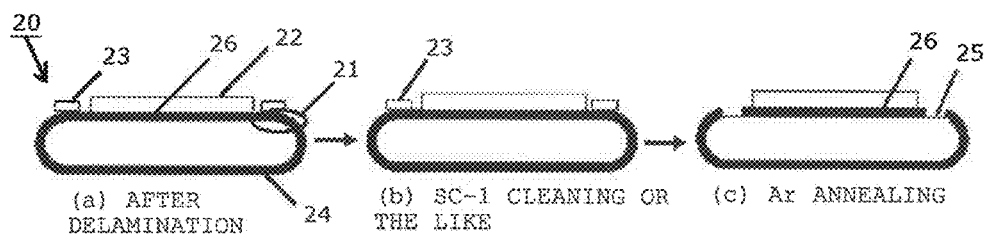
FIG. 2 is an explanatory diagram of a cause of generation of depressions that appear on an oxide film in a terrace portion and the mechanism thereof.

Hereinafter, a cause of generation of depressions which appear on an oxide film in a terrace portion when flattening heat treatment is performed in an atmosphere containing argon gas and the mechanism thereof, which provide motivation to make the present invention, will be described in detail by using FIG. 2.

When a SOI wafer 20 is fabricated by using an ion implantation delamination method, a region in which a SOI layer 22 is not transferred, which is called a terrace portion 21, is formed on a wafer periphery (FIG. 2(a)). This is a region which is formed for the following reason: since the peripheries of material wafers before being bonded together each have a shape of a sag due to polishing or the like, when the wafers are bonded together, the wafer peripheries cannot be bonded completely and a Si layer in this non-bonded portion cannot be transferred, and this region is called the terrace portion 21.

Although the SOI layer 22 is not transferred to the terrace portion 21, gas ions for delamination, such as hydrogen ions, are implanted in the position of a bond wafer corresponding to the terrace portion 21. As a result, the hydrogen ions implanted thereinto are blistering by delamination heat treatment and the bond wafer delaminates in this position, and silicon thin pieces 23 are formed. If these silicon thin pieces 23 adhere to the terrace portion 21, the adhesion is increased by the delamination heat treatment. Moreover, at the time of the delamination heat treatment, delamination and a fracture occur in an edge portion of the SOI layer 22, which sometimes causes the silicon thin pieces 23 to be formed and placed on the terrace portion 21. Therefore, after the delamination heat treatment, wet cleaning such as SC-1 cleaning is sometimes performed (FIG. 2(b)).

However, when a SOI wafer 20 having a relatively thick SOI layer 22 is fabricated, if the SOI layer 22 at the time of delamination is thickened (for example, 500 nm or more), silicon thin pieces 23 which delaminate at the time of delamination are also thickened. As a result, since the stiffness of the silicon thin pieces themselves increases, the area of each silicon thin piece 23 which delaminates becomes relatively large. Even when cleaning after delamination is performed in such a situation, the large surface area of each silicon thin piece 23 makes it difficult for a cleaning fluid to enter between the silicon thin pieces 23 and a Si substrate. That is, it is impossible to remove the silicon thin pieces 23 from the wafer by lift-off at the time of cleaning, which causes the silicon thin pieces 23 to be left in a post-process. That is, the larger the thickness of the silicon thin pieces 23 (the deeper the depth of ion implantation into the bond wafer), the more difficult to remove the formed silicon thin pieces 23.

Moreover, for example, when a SOI wafer 20 having a BOX layer 26 (a buried oxide film layer, which is part of an oxide film 24, sandwiched between a base wafer and the SOI layer 22) having a thickness of a few hundred nanometers or more is fabricated, because of the constraints of an acceleration power supply of an ion implanter, it is sometimes impossible to perform ion implantation on the Si layer through the thick oxide film formed on the bond wafer surface. In this case, a main oxide film 24 which becomes the BOX layer 26 is formed on the base wafer, ion implantation is performed on a bare wafer (or a wafer with an oxide film, the wafer on which a thin oxide film is formed), and wafer delamination is performed.

Here, if ion implantation is performed on the wafer with an oxide film and delamination is then performed, delaminated silicon thin pieces are formed of the oxide film and the Si layer. In this case, due to a difference in a coefficient of thermal expansion between Si and the oxide film, the silicon thin pieces warp like a bimetal. On the other hand, if ion implantation is performed on the bare wafer and delamination is then performed, the silicon thin pieces do not warp because the silicon thin pieces are formed only of Si. If cleaning after delamination is performed in such a situation, since the silicon thin pieces do not warp, a space is not formed between the silicon thin pieces and the Si substrate, which makes it impossible for a cleaning fluid to enter therebetween. That is, it becomes extremely difficult to remove the silicon thin pieces from the wafer by lift-off at the time of cleaning, which causes the silicon thin pieces to be left in a post-process. That is, performing ion implantation into the bond wafer without an oxide film makes it more difficult to remove the formed silicon thin pieces than when ion implantation is performed through an oxide film.

The inventors of the present invention have found out that such silicon thin pieces 23 adhering to the silicon oxide film 24 in the terrace portion 21 become depressions 25 in the terrace portion 21 when flattening heat treatment is performed afterward (FIG. 2(c)). That is, at the time of high-temperature annealing in an atmosphere containing argon gas by which flattening of a delaminating plane is performed, if the silicon thin pieces 23 are placed on the silicon oxide film 24 in the terrace portion 21, the silicon thin pieces 23 and the silicon oxide film 24 react and, based on a reaction formula: $Si+SiO_2 \rightarrow 2SiO$ (gas), the silicon oxide film 24 in the terrace portion 21 is greatly etched around the silicon thin pieces 23. The depressions 25 caused by this etching are detected as bright spots in sensory testing at the time of a final inspection. If a device production process is performed in a state in which such depressions 25 are formed in the terrace portion 21, a photoresist tends to remain therein, which becomes a source of generation of contamination or particles. Therefore, the inventors of the present invention have found out that it is necessary to prevent such depressions 25 from being generated and perform flattening heat treatment in an atmosphere containing argon gas in a state in which the silicon thin pieces 23 on the oxide film in the terrace portion are adequately removed.

As for the influence of silicon thin pieces adhering to an oxide film in a terrace portion, polysilicon growth in the terrace portion by epitaxial growth is disclosed in Patent Document 3. However, a problem of the generation of depressions in a terrace portion in heat treatment unaccompanied by film growth, such as flattening heat treatment in an atmosphere containing argon gas, has not been known at all in the past and the inventors of the present invention are the first people who found out this phenomenon.

An object of the present invention is to flatten a delaminating plane without formation of such depressions in a terrace portion. Hereinafter, the present invention will be further described in detail.

Figure 1:
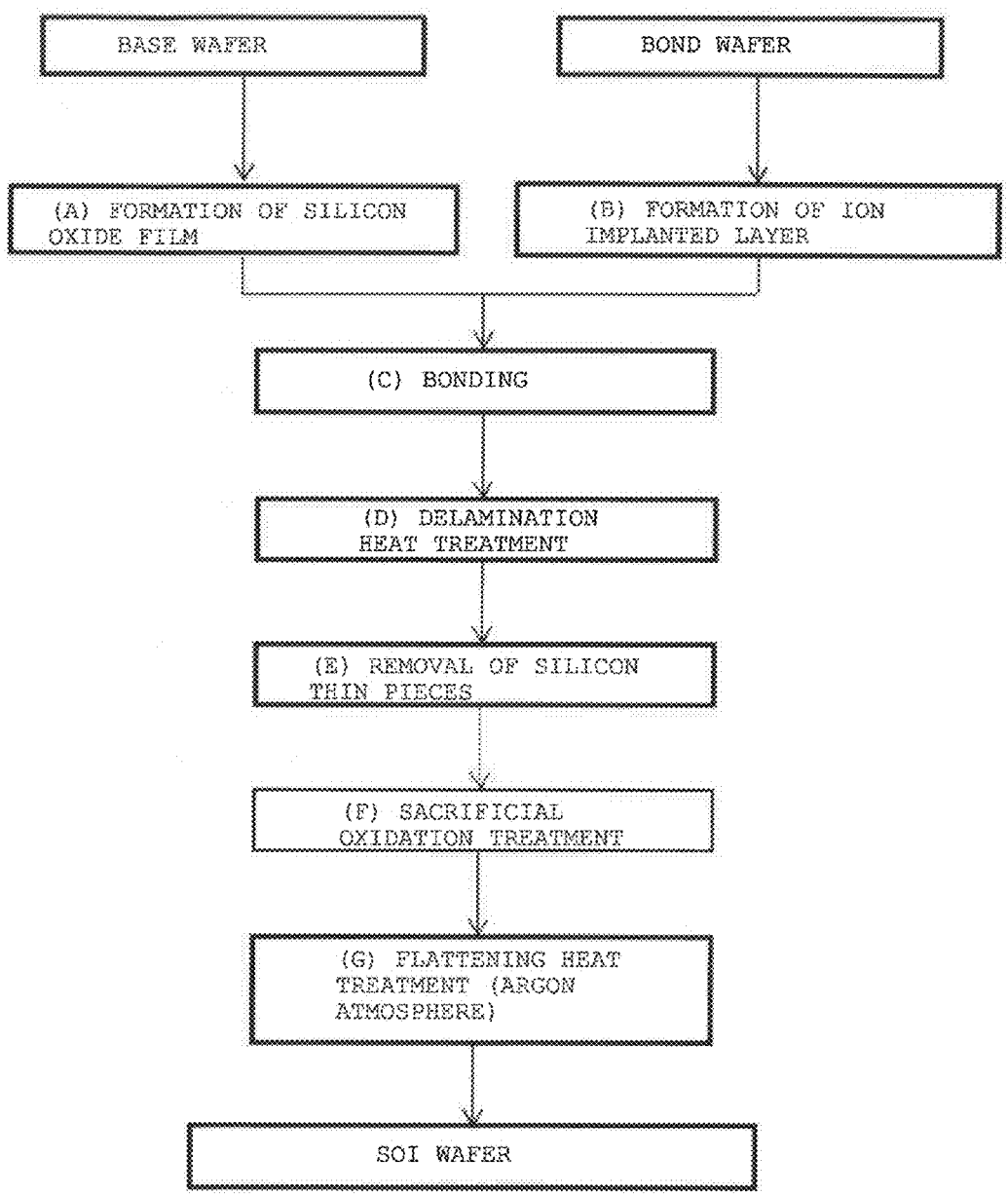
FIG. 1 is a process flow diagram depicting an example of a method for producing a SOI wafer of the present invention.

In FIG. 1, a process flow diagram of an example of a method for producing a SOI wafer of the present invention is depicted.

First, on a surface of a base wafer formed of a silicon single crystal, a silicon oxide film is formed by thermal oxidation or the like (FIG. 1(A)). Incidentally, the thickness of the silicon oxide film which is formed is not limited to a particular thickness; in the present invention, the thickness of the silicon oxide film can be set at 2 μm, for example.

Moreover, at least one type of gas ion selected from a hydrogen ion and a rare gas ion is implanted from a surface of a bond wafer formed of a silicon single crystal, whereby an ion implanted layer is formed at a predetermined depth of the bond wafer (FIG. 1(B)). The depth of this ion implanted layer reflects the thickness of a SOI layer which is formed after delamination. Therefore, by performing ion implantation while controlling implantation energy or the like, it is possible to control the thickness of the SOI layer. Incidentally, in so doing, ion implantation may be performed on the bond wafer formed of a silicon single crystal without an oxide film on the surface thereof, or a thin silicon oxide film may be formed on the bond wafer and ion implantation may be performed through the oxide film.

The processing which is performed on the base wafer and the processing which is performed on the bond wafer can be performed independently; one processing may be performed before the other or these processing may be concurrently performed.

Then, the ion-implanted surface of the bond wafer and the surface of the base wafer formed of a silicon single crystal are bonded through the silicon oxide film formed on the base wafer surface (FIG. 1(C)). This bonding is performed, for example, as follows: by bringing the bond wafer and the base wafer into contact with each other in a clean atmosphere at room temperature, the wafers adhere to each other without use of an adhesive or the like.

Next, by delaminating the bond wafer at the ion implanted layer by performing delamination heat treatment, a SOI wafer having a buried oxide film layer (a BOX layer) and a SOI layer on the base wafer is fabricated (FIG. 1(D)). As the delamination heat treatment, for example, by performing heat treatment in an atmosphere of an inert gas such as Ar usually at 400° C. or higher and 700° C. or lower for 30 minutes or more, the bond wafer can be delaminated at the ion implanted layer; for example, 500° C. and 30 minutes can be adopted.

Figure 3:
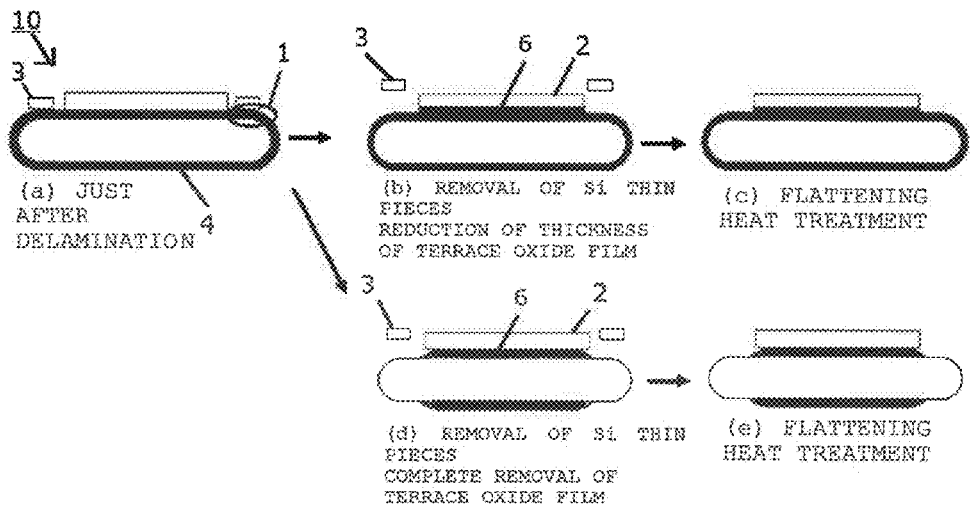
FIG. 3 is a schematic diagram that explains the method for producing a SOI wafer of the present invention.

As described above, when a bonded SOI wafer is fabricated by an ion implantation delamination method by using the base wafer with a surface on which the oxide film is formed, as depicted in FIG. 3(a), many silicon thin pieces 3 adhere to a silicon oxide film 4 in a terrace portion 1 of a SOI wafer 10 just after delamination on which the delamination heat treatment was performed.

In the present invention, after the delamination heat treatment, without inserting another heat treatment, processing to remove the silicon thin pieces 3 present on the silicon oxide film 4 in the terrace portion 1 of the SOI wafer 10 is performed (FIG. 1(E)).

As for this removal of the silicon thin pieces 3, no problem arises if the silicon thin pieces 3 can be removed by normal cleaning such as RCA cleaning; however, if a wafer having a large delamination thickness or a bond wafer which is a bare wafer is used, the silicon thin pieces 3 cannot be removed only by RCA cleaning in some cases.

Thus, by using an aqueous solution containing HF (hydrogen fluoride) as cleaning which is performed after delamination and performing etching that reduces the oxide film thickness of the terrace portion 1, it is possible to remove the silicon oxide film 4 between the silicon thin pieces 3 and the terrace portion 1 and perform lift-off of the silicon thin pieces 3 and thereby effectively remove the silicon thin pieces 3 on the terrace oxide film (FIG. 3(b)). As the aqueous solution containing HF, a 15% HF aqueous solution, for example, can be used. Since a thickness to be reduced depends on a delamination temperature or a SOI layer thickness at the time of delamination, a thickness to be reduced is not limited to a particular thickness as long as the silicon thin pieces can be removed; for example, a thickness to be reduced can be set at 1 to 100 nm and it is preferable to set a thickness to be reduced at 5 nm or more.

Moreover, in so doing, the silicon thin pieces 3 can be removed by completely removing the silicon oxide film 4 in the terrace portion 1 as depicted in FIG. 3(d). However, it is preferable not to remove the terrace oxide film completely because this causes the periphery of the SOI layer 2 to have the shape of an overhang by over etching of the BOX layer 6 and, in addition thereto, etching of an interface between the SOI layer 2 and the BOX layer 6 progresses by subsequent high-temperature annealing (flattening heat treatment) in an atmosphere containing argon gas and a SOI layer in the shape of a thin film is formed, which can be a new particle generation source.

In addition to the method using an aqueous solution containing HF, the silicon thin pieces 3 can also be effectively removed by performing cleaning (cleaning by a physical action) by which a wafer surface is rubbed with a sponge or the like, such as scrub cleaning.

Here, in a bonded SOI wafer production process using the ion implantation delamination method, sacrificial oxidation treatment (sacrificial oxidation+removal of an oxide film) is sometimes performed on the SOI layer surface after delamination in order to remove the damaged layer which appeared at the time of ion implantation and at the time of delamination or RTA (rapid thermal anneal) or the like is sometimes performed to control oxygen precipitation in the wafer or for quality improvement such as an improvement in surface roughness. However, since the heat treatment temperature of these types of heat treatment is higher than that of the delamination heat treatment, the adherence strength between the silicon thin pieces and the terrace portion oxide film is increased, which makes it impossible to remove the silicon thin pieces even when HF cleaning is performed after these types of heat treatment. Therefore, in the present invention, removal of the silicon thin pieces on the oxide film in the terrace portion has to be performed after the delamination heat treatment without inserting another heat treatment (other than the delamination heat treatment).

After the processing to remove the silicon thin pieces is performed in this manner, common RCA cleaning (for example, SC-1 cleaning) can also be performed if necessary. By these processes, a state in which no silicon thin piece is present on the terrace oxide film can be created.

After the silicon thin pieces are removed in this way, flattening heat treatment is performed in an atmosphere containing argon gas; however, before this treatment, it is preferable to perform sacrificial oxidation treatment on the SOI layer of the SOI wafer (FIG. 1(F)). By performing sacrificial oxidation heat treatment at a temperature of about 900° C., for example, it is possible to oxidize the damage of the SOI layer surface and, at the same time, increase the bonded interface bonding strength. Then, in order to remove the sacrificial oxide film on the SOI layer surface, 15% HF cleaning and, if necessary, RCA cleaning are performed. Since the damage of the delaminating plane can be adequately removed by performing such sacrificial oxidation treatment, it is possible to obtain a SOI layer with a high degree of crystallinity.

Then, on the SOI wafer 10 from which the silicon thin pieces 3 on the silicon oxide film 4 in the terrace portion 1 are removed, flattening heat treatment is performed in an atmosphere containing argon gas (FIG. 1(G) and FIGS. 3(c) and (e)). As conditions of the flattening heat treatment, for example, heat treatment in a 100% Ar gas atmosphere at 1200° C. for two hours can be adopted.

By the flattening heat treatment, the surface roughness caused by delamination at the ion implanted layer is improved, which makes it possible to form a wafer surface that achieves a level at which the wafer can be used as a device. Moreover, in the present invention, by fabricating a SOI wafer with no silicon thin piece on an oxide film in a terrace portion and performing flattening heat treatment thereon in an atmosphere containing argon gas, it is possible to prevent an appearance of bright spots (that is, depressions) caused by the silicon thin pieces, which would appear in a terrace portion in the past after the flattening heat treatment in an atmosphere containing argon gas, and maintain a clear state of the terrace portion. As a result, it is possible to avoid the generation of contamination or particles in the device production process.

Then, sacrificial oxidation may be performed for further removal of a residual damaged layer and SOI layer film thickness adjustment.

Moreover, in order to reduce a load of high-temperature heat treatment in an atmosphere containing argon gas for flattening and prevent the generation of slip dislocation, it is also possible to perform RTA (H$_2$RTA) in a hydrogen atmosphere before the flattening heat treatment in an atmosphere containing argon gas. The order of processes in this case is as follows.

Delamination heat treatment→Removal of silicon thin pieces→H$_2$RTA→Sacrificial oxidation treatment→Ar annealing As described above, by performing H$_2$RTA (for example, 1150° C., 60 seconds), it is also possible to reduce the temperature of Ar annealing to a temperature below 1200° C.

EXAMPLES

Hereinafter, the present invention will be described more specifically with Examples and Comparative Examples, but the present invention is not limited to these Examples.

Examples 1 to 3

Figure 4:
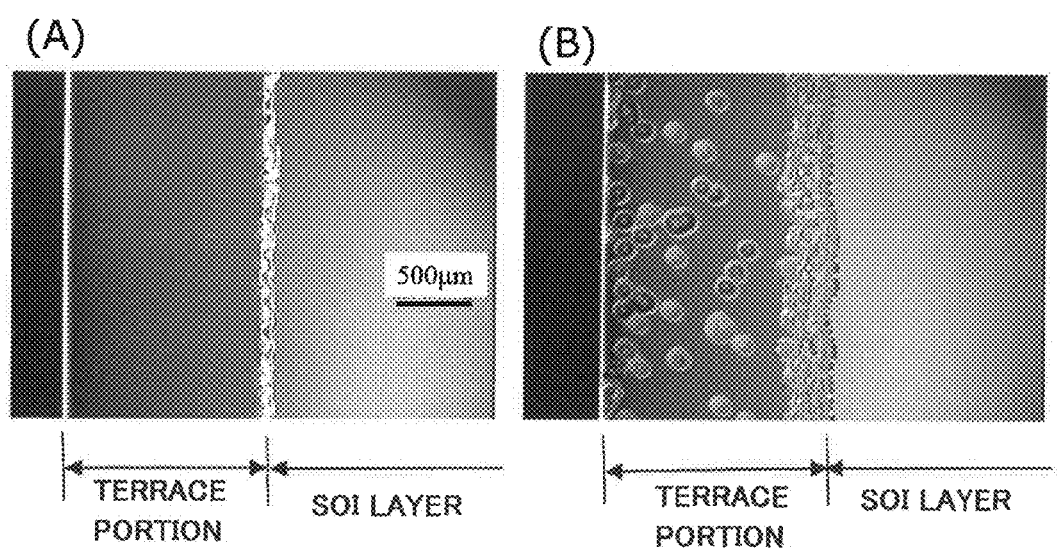
FIG. 4 shows photomicrographs near the boundary between a terrace portion and a SOI layer. (A) is a photograph showing the result in Example 2. (B) is a photograph showing the result in Comparative Example 2.

A bonded SOI wafer was produced by using silicon single crystal wafers with a diameter of 300 mm and crystal orientation <100> as a bond wafer and a base wafer under conditions of Table 1 (Examples 1 to 3), and the presence or absence of depressions in a terrace portion was observed under a microscope. In Examples 1 to 3, no bright spot (depression) was observed and a clean terrace portion was formed. Incidentally, a photomicrograph of Example 2 is shown in FIG. 4(A).

TABLE 1

|  | Example 1 | Example 2 | Example 3 |
|---|---|---|---|
| Bond wafer oxide film | Not formed | Not formed | 100 nm |
| Base wafer oxide film | 2000 nm | 2000 nm | 2000 nm |
| Ion implantation | 60 keV $7 \times 10^{16}/cm^2$ Implantation angle 7° | 60 keV $7 \times 10^{16}/cm^2$ Implantation angle 7° | 60 keV $7 \times 10^{16}/cm^2$ Implantation angle 0° |
| Delamination heat treatment | Horizontal furnace, 500° C., 30 minutes, Ar 100% atmosphere | | |
| Thickness of delamination film (silicon film on oxide film) | About 570 nm | About 570 nm | About 570 nm |
| Silicon thin piece removal processing | Reducing the thickness of terrace oxide film by 100 nm by using 15 wt % HF aqueous solution | | |
| H$_2$ RTA | Not performed | Not performed | 100% H$_2$ 1200° C., 30 sec |
| Sacrificial oxidation treatment | Not performed | 900° C., pyro oxidation, oxide film thickness 200 nm Oxide film removal: 15 wt % HF aqueous solution | |
| Flattening heat treatment (Ar annealing) | 100% Ar atmosphere, 1200° C., 2 h | 100% Ar atmosphere, 1200° C., 2 h | 100% Ar atmosphere, 1170° C., 2 h |
| Depression in terrace portion | No depression | No depression (FIG. 4A) | No depression |

Example 4

After the processing was performed to Ar annealing under the same conditions as Example 3 except that scrub cleaning by which the wafer surface is rubbed with a sponge in pure water was performed as the silicon thin piece removal process, depressions in the terrace portion were observed under a microscope, and no depression was observed.

Comparative Examples 1 to 3

A SOI wafer was produced by using silicon single crystal wafers with a diameter of 300 mm and crystal orientation <100> as a bond wafer and a base wafer under conditions of Table 2, that is, by performing only SC-1 cleaning after the delamination heat treatment (without performing processing to remove the silicon thin pieces present on the silicon oxide film in the terrace portion of the SOI wafer) (Comparative Examples 1 to 3), and the presence or absence of depressions in the terrace portion was observed under a microscope. Incidentally, a photomicrograph of Comparative Example 2 is shown in FIG. 4(B).

TABLE 2

|  | Comparative Example 1 | Comparative Example 2 | Comparative Example 3 |
|---|---|---|---|
| Bond wafer oxide film | Not formed | Not formed | 100 nm |
| Base wafer oxide film | 2000 nm | 2000 nm | 2000 nm |
| Ion implantation | 60 keV $7 \times 10^{16}/cm^2$ Implantation angle 7° | 60 keV $7 \times 10^{16}/cm^2$ Implantation angle 7° | 60 keV $7 \times 10^{16}/cm^2$ Implantation angle 0° |
| Delamination heat treatment | Horizontal furnace, 500° C., 30 minutes, Ar 100% atmosphere | | |
| Thickness of delamination film (silicon film on oxide film) | About 570 nm | About 570 nm | About 570 nm |
| Silicon thin piece removal processing | Not performed (Only SC-1 cleaning was performed) | Not performed (Only SC-1 cleaning was performed) | Not performed (Only SC-1 cleaning was performed) |
| H$_2$ RTA | Not performed | Not performed | 100% H$_2$ 1200° C., 30 sec |
| Sacrificial oxidation treatment | Not performed | 900° C., pyro oxidation, oxide film thickness 200 nm Oxide film removal: 15 wt % HF aqueous solution | |
| Flattening heat treatment (Ar annealing) | 100% Ar atmosphere, 1200° C., 2 h | 100% Ar atmosphere, 1200° C., 2 h | 100% Ar atmosphere, 1170° C., 2 h |
| Depression in terrace portion | Appeared | Appeared (FIG. 4B) | Appeared |

In Comparative Example 1, since flattening heat treatment was performed without removal of the silicon thin pieces in the terrace portion, depressions appeared in the terrace portion by Ar annealing. In Comparative Examples 2 and 3, although the thickness of the oxide film in the terrace portion was also reduced by removal of the oxide film at the time of sacrificial oxidation treatment before flattening heat treatment (Ar annealing), the silicon thin pieces were not removed because of tight adhesion thereof by the oxidation heat treatment or H$_2$RTA, which resulted in the appearance of depressions in Ar annealing.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for producing a SOI wafer, comprising: implanting at least one type of gas ion selected from a hydrogen ion and a rare gas ion from a surface of a bond wafer formed of a silicon single crystal to form an ion implanted layer, bonding the ion-implanted surface of the bond wafer to a surface of a base wafer formed of a silicon single crystal through a silicon oxide film formed on the base wafer surface, delaminating the bond wafer at the ion implanted layer by performing delamination heat treatment to fabricate a SOI wafer having a buried oxide film layer and a SOI layer on the base wafer, and performing flattening heat treatment on the SOI wafer in an atmosphere containing argon gas, wherein,
after the delamination heat treatment, without inserting another heat treatment, processing to remove silicon thin pieces present on the silicon oxide film in a terrace portion of the SOI wafer is performed, and thereafter, the flattening heat treatment is performed in the atmosphere containing argon gas, wherein
after the processing to remove the silicon thin pieces is performed, and before the flattening heat treatment is performed, sacrificial oxidation treatment is performed on the SOI layer of the SOI wafer, and wherein
the processing to remove the silicon thin pieces is performed by:

etching to reduce a thickness of the silicon oxide film in the terrace portion by using an aqueous solution containing HF, or cleaning by a physical action.

2. The method according to claim 1, wherein the processing to remove the silicon thin pieces is performed by etching to reduce a thickness of the silicon oxide film in the terrace portion by using an aqueous solution containing HF.

3. The method according to claim 1, wherein the processing to remove the silicon thin pieces is performed by cleaning by a physical action.

* * * * *